(12) United States Patent
Cotte et al.

(10) Patent No.: US 6,398,875 B1
(45) Date of Patent: Jun. 4, 2002

(54) PROCESS OF DRYING SEMICONDUCTOR WAFERS USING LIQUID OR SUPERCRITICAL CARBON DIOXIDE

(75) Inventors: John Michael Cotte, New Fairfield, CT (US); Dario L. Goldfarb, Putnam Valley, NY (US); Kenneth John McCullough, Fishkill, NY (US); Wayne Martin Moreau, Wappinger, NY (US); Keith R. Pope, Danbury, CT (US); John P. Simons; Charles J. Taft, both of Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/893,231

(22) Filed: Jun. 27, 2001

(51) Int. Cl.7 ................................................. B08B 3/04
(52) U.S. Cl. .................. 134/2; 134/3; 134/10; 134/11; 134/31; 134/34; 134/36; 134/37; 134/41; 134/902; 34/448; 34/467; 34/468; 34/469; 34/470; 34/516; 34/517
(58) Field of Search ............................ 134/2, 3, 10, 11, 134/31, 34, 36, 37, 41, 902; 34/448, 467, 468, 469, 470, 516, 517

(56) References Cited

U.S. PATENT DOCUMENTS

| | | | |
|---|---|---|---|
| 3,597,289 A | 8/1971 | Kohl et al. | 156/17 |
| 4,541,568 A | 9/1985 | Lichfield | 239/441 |
| 4,781,764 A | 11/1988 | Leenaaras | 134/34 |
| 4,788,992 A | 12/1988 | Swainbank et al. | 134/64 R |
| 4,984,597 A | 1/1991 | McConnell et al. | 134/95 |
| 5,055,138 A | 10/1991 | Slinn | 134/11 |
| 5,183,067 A | 2/1993 | Slinn | 134/61 |
| 5,243,768 A | 9/1993 | Fukao et al. | 34/22 |
| 5,333,628 A | 8/1994 | Ogata et al. | 134/64 R |
| 5,335,681 A | 8/1994 | Schmidt | 134/64 R |
| 5,339,842 A | 8/1994 | Bok | 134/1 |
| 5,351,419 A | 10/1994 | Franka et al. | 34/74 D |
| 5,371,950 A | 12/1994 | Schumacher | 34/78 |
| 5,437,733 A | 8/1995 | Okumura | 134/34 |
| 5,520,744 A | 5/1996 | Fujikawa et al. | 134/11 |
| 5,571,337 A | 11/1996 | Mohindra et al. | 134/25.4 |
| 5,660,642 A | 8/1997 | Britten | 134/30 |
| 5,789,505 A | * 8/1998 | Wilkinson et al. | 526/209 |
| 5,908,510 A | 6/1999 | McCullough et al. | 134/2 |
| 6,067,728 A | * 5/2000 | Farmer et al. | 34/470 |
| 6,090,217 A | * 7/2000 | Kittle | 134/11 |
| 6,149,828 A | * 11/2000 | Vaartstra | 216/57 |
| 6,199,298 B1 | * 3/2001 | Bergman | 34/315 |
| 6,288,826 B1 | * 5/2001 | Deyoung et al. | 510/291 |
| 6,277,753 B1 | * 8/2001 | Mullee et al. | 438/692 |
| 6,310,017 B1 | * 10/2001 | Grant et al. | 510/175 |
| 6,334,266 B1 | * 1/2002 | Mortiz et al. | 34/337 |

FOREIGN PATENT DOCUMENTS

JP 03127832 A * 5/1991

* cited by examiner

Primary Examiner—Sharidan Carrillo
(74) Attorney, Agent, or Firm—Scully, Scott, Murphy & Presser; Daniel P. Morris

(57) ABSTRACT

A process of drying a semiconductor wafer which includes at least one microelectric structure disposed thereon which includes contacting a water-containing thin film-covered semiconductor wafer with a composition which includes liquid or supercritical carbon dioxide and a surfactant.

10 Claims, 2 Drawing Sheets

PROCESS OF DRYING SEMICONDUCTOR WAFERS USING LIQUID OR SUPERCRITICAL CARBON DIOXIDE

BACKGROUND OF THE DISCLOSURE

1. Field of the Invention

The present invention is directed to a process of drying semiconductor wafers employing liquid or supercritical carbon dioxide. More specifically, the present invention is directed to a process of drying semiconductor wafers characterized by the presence of surfaces having high aspect ratios utilizing a drying composition which includes liquid or supercritical carbon dioxide.

2. Background of the Prior Art

The processing of semiconductor wafers, which are subsequently cut into semiconductor devices, involves several processing procedures such as photoresist development and wet etching. These processing procedures all include the step of removing by-product chemical species by water rinsing. With the advent of smaller and smaller sized semiconductor chips the subsequent step of drying the semiconductor wafer to remove all trace of rinse water and any dissolved species dispersed, dissolved or emulsified therewith has become an increasingly difficult operation.

Older methods of water removal from semiconductor wafers, which were successful in the past, because of the relatively large size of the structures formed on semiconductor wafers, are no longer effective in removing water remaining after rinsing. This is because of the inclusion, on the semiconductor wafer, of high aspect ratio holes, indentations, vias and the like, e.g. height to width ratios of 2 or more. In view of the relatively high surface tension of water, water removal from such structures poses a difficult technological problem. Indeed, water removal can damage the electrical assembly structure.

The aforementioned problem is appreciated in the recent prior art. Thus, new methods of drying semiconductor wafers, without the utilization of heat or turbulent gas flow, which overcomes the surface tension problems discussed above, but which create new problems involving residues, have been suggested. For example, the use of ultrasonic or megasonic energy in the removal of liquid medium is disclosed in U.S. Pat. Nos. 4,788,992; 5,333,628; and 5,339,842.

Another method of drying semiconductor substrates advanced in the prior art involves the use of so-called "vapor dryers". In this method a vapor, of which isopropanol and fluorinated hydrocarbons are preferred, is condensed on the surface of a semiconductor wafer to flush aqueous liquid therefrom. Examples of this method are provided in U.S. Pat. Nos. 5,055,138; 5,183,067; 5,243,768; 5,351,419; and 5,371,950.

More recently, as semiconductors have become more and more miniaturized, even reaching the nanometer size range, "Marangoni" type drying has been advanced. In this procedure a solvent vapor is applied to an aqueous film, which lowers the surface tension of the liquid film, inducing the aqueous liquid film to leave the surface of the wafer. Such a process is described in U.S. Pat. No. 5,660,642.

A still further improvement in drying of semiconductor wafers is provided by U.S. Pat. No. 6,067,728. The '728 patent advances a method in which a semiconductor wafer is submerged in methanol and thereupon contacted with supercritical carbon dioxide. Although this method represents an improvement over earlier processes of drying semiconductor wafers, it is costly and environmentally unfriendly insofar as methanol, which is highly flammable, is released to the atmosphere.

The above description of prior art methods of drying semiconductor wafers suggests the need in the art for a further improved process for removing residual water especially in those wafers provided with topographical structures having high aspect ratios.

BRIEF SUMMARY OF THE INVENTION

A new process has now been discovered which provides significant improvement in the removal of water from semiconductor wafers. Although the present invention is independent of any theory explaining its operation, it is postulated that the process of the present invention represents a significant improvement over prior art methods insofar as the present process results in significant reduction of interfacial tension between the extracting fluid and the film of water which is sought to be removed. In addition, the process of the present invention increases coalescence or dissolution of water in the extracting fluid.

In accordance with the present invention a process of drying a semiconductor wafer having a microelectronic structure thereon with a composition which comprises liquid or supercritical carbon dioxide and a surfactant wherein the surfactant is present in a concentration of between about 0.1% and about 50% by weight, based on the total weight of the composition, is provided.

BRIEF SUMMARY OF THE DRAWINGS

The present invention may be better understood by reference to the accompanying of which.

DETAILED DESCRIPTION

Figure 1:
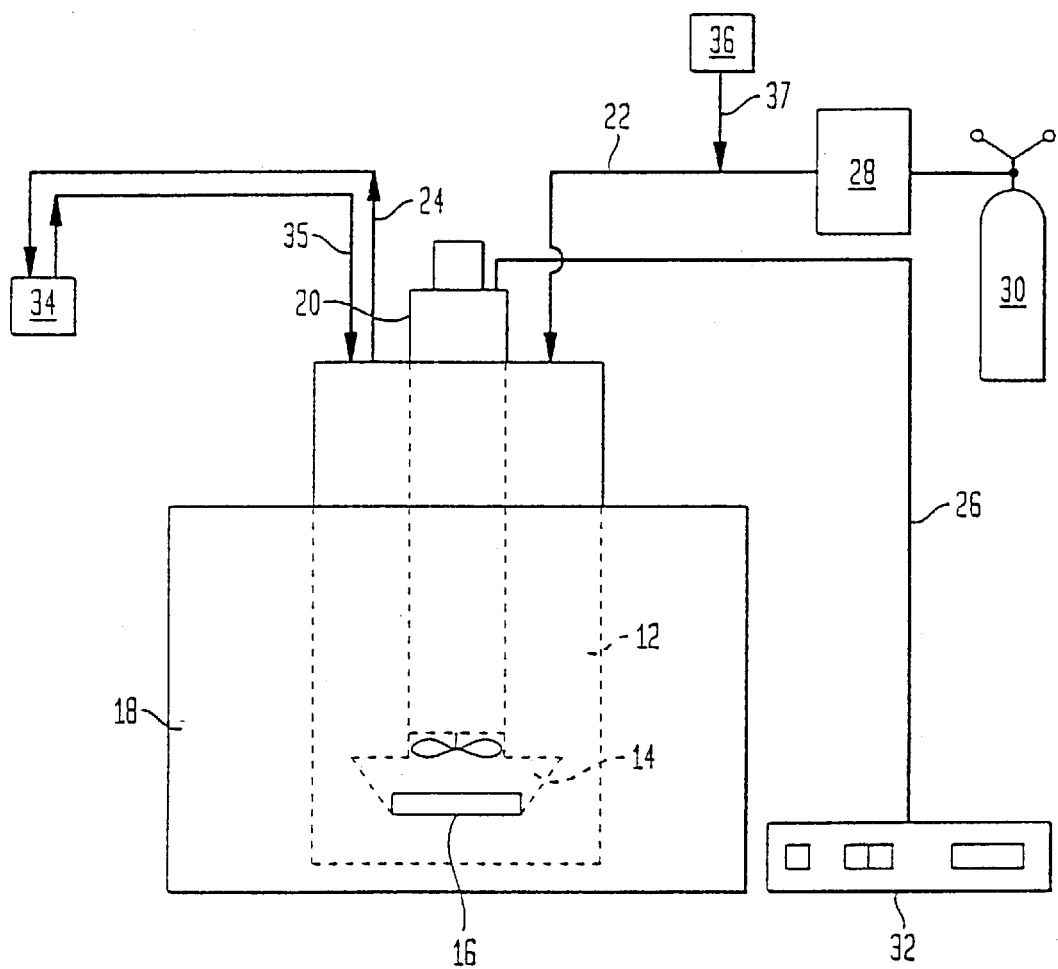
FIG. 1 is a schematic diagram of an apparatus employed in the present invention for removing a water-containing fluid from a semiconductor wafer having a microelectronic structure thereon.

The present invention is directed to a process of drying of a semiconductor wafer containing a microelectronic structure thereon which has been subjected to wet processing in accordance with methods well known in the art of producing semiconductor chips. In common with many of these processes, the penultimate step in such processes is the rinsing of the wafer with deionized water to remove photoresist residue, photoresist acid rinse residues and the like. The ultimate step is the drying of the wafer to remove all rinse water and any materials contained therein.

To overcome the problems of drying semiconductor wafers encountered in the prior art a composition has been developed for removal of water-containing films on semiconductor wafers which comprises a liquid or supercritical carbon dioxide composition. The liquid or supercritical carbon dioxide composition includes supercritical carbon dioxide and a surfactant. Preferably, the composition comprises a surfactant in a concentration in the range of between about 0.01% and about 50% by weight, based on the total weight of the composition. More preferably, the surfactant concentration is in the range of between about 0.1% and about 25% by weight. Still more preferably, the concentration of surfactant is in the range of between about 0.1% and about 5%. Yet still more preferably, the surfactant constituent is present in an amount of between about 0.1% and about 1%. Most preferably, the surfactant constituent represents between about 0.1% and about 0.5% by weight. It is emphasized that all of the aforementioned concentrations are based on the total weight of the composition.

Surfactants within the contemplation of the present invention include polyethers, siloxanes, fluoroalkanes, reaction products thereof and mixtures thereof. Although many polyether, siloxane and fluoroalkane surfactants known in the art are useful in the present invention, certain of these surfactants are particularly preferred for utilization in the process of the present invention. For example, amongst polyether surfactants, polyalkylene oxides are preferred. Thus, such polyethers as poly(ethylene oxide) (PEO), poly (propylene oxide) (PPO) and poly(butylene oxide) (PBO) are particularly preferred. Block copolymers of these polyalkylene oxides, such as (PPO-b-PEO-b-PPO) and (PEO-b-PPO-b-PEO), i.e. Pluronic® and Tetronic® triblock copolymers, and (PBO-b-PEO) are particularly preferred. Another polyether surfactant particularly useful in the present invention combines a polyether with a fluorine-containing polymer. That surfactant is perfluoropolyether ammonium carboxylate.

Turning to fluorine-containing surfactants, several fluoroalkanes are useful as the surfactant of the present invention. Among fluoroalkane surfactants such species as 4-(perfluoro-2-isopropyl-1,3-dimethyl-1-butenyloxy) benzoic acid (PFBA) and 4-(perfluoro-2-isopropyl-1,3-dimethyl-1-butenyloxy)benzene sulfonic acid (PFBS) find particular application as the surfactant of the composition of the present invention.

Amongst the siloxanes preferred for utilization as the surfactant of the composition of the present invention, preference is given to such species as poly (dimethylsiloxane) copolymers (PDMS). As stated above, combinations of these surfactants are preferred. Thus, the combination of a siloxane and a polyether, such as PDMS with PEO-PPO, e.g. (PDMS-g-PEO-PPO), is particularly desirable.

The composition employed in the process of the present invention can, in addition to liquid or supercritical carbon dioxide and a surfactant, include a further component, a co-solvent. A preferred co-solvent, within the scope of the present invention, is a diacid having the structural formula HOOC—$(CH_2)_n$—COOH, where n is 0, 1 or 2; a sulfonic acid having the structural formula $RSO_3H$, where R is hydrogen, methyl, ethyl or $CF_3$; a carboxylic acid having the structural formula $R^1COOH$, where $R^1$ is hydrogen, $CF_3$, $C_2F_5$, methyl, ethyl or propyl; triethanolamine; an alcohol having the structural formula $R^2OH$, where $R^2$ is methyl, ethyl or isopropyl; tetrahydrofuran; N-methyl pyrrolidone; gamma-butyrolactone; dimethylsulfoxide; and mixtures thereof.

In the preferred embodiment wherein the solvent is a diacid, oxalic acid is preferred. In the preferred embodiment wherein a carboxylic acid is utilized, formic acid, acetic acid or perfluoroacetic acid is particularly preferred.

A co-solvent, if present in the composition, is preferably included in a concentration in the range of between about 1% and about 25% by volume, based on the total volume of the co-solvent and the liquid or supercritical carbon dioxide. More preferably, the concentration of the co-solvent is in the range of between about 5% and about 10% by volume, based on the total volume of the co-solvent and liquid or supercritical $CO_2$. Most preferably, the co-solvent, if included, is present in a concentration of between about 6% and about 8% by volume, based on the total volume of the solvent and the liquid or supercritical $CO_2$.

In another preferred embodiment of the composition utilized in the process of the present invention, the composition, in addition to liquid or supercritical carbon dioxide and a surfactant, includes an oxygen-containing compound selected from the group consisting of a ketal, an acetal or an ether along with a lesser amount of an acid. In this embodiment the combined concentration of the oxygen-containing compound and acid is about 1% to about 5% by weight, based on the total weight of the composition. Furthermore, the molar ratio of the ketal, acetal or ether oxygen-containing compound to acid is in the range of between about 1:1 and about 10:1. More preferably, the molar ratio of ketal, acetal or ether to acid is in the molar range of between about 1:1 and about 5:1.

Amongst the preferred oxygen-containing compounds preferred for use in this application are dimethylacetal, acetone dimethylacetal, acrolein dimethylacetyl, 3-methoxypropionaldehyde dimethylacetal, 2-methoxypropene and 1-methoxycyclohexene. Preferred acids utilized in this preferred embodiment of the composition employed in the process of the present invention are acetic acid, fluoroacetic acid and methylsulfonic acid.

In practice, a semiconductor wafer 16 containing a water-containing film is placed in a sample zone 14 of a process chamber 12 wherein the wafer 16 is exposed to a composition which includes liquid or supercritical carbon dioxide and a surfactant under thermodynamic conditions which permit the removal of the water-containing film disposed on wafer 16 while maintaining the supercritical carbon dioxide above its critical temperature and pressure. Typically, the pressure within process chamber 12 during water-containing film removal is in the range of from about 1,000 psi to about 8,000 psi. Preferably, the pressure maintained in chamber 12 is from about 2,000 psi to about 5,000 psi. More preferably, the pressure within process chamber 12 is about 3,000 psi. The temperature within process chamber 12 during water-containing film removal is in the range of between about 32° C. to about 100° C. Preferably, the temperature in chamber 12 is in the range of from about 50° C. and about 80° C. More preferably, the temperature within the process chamber during water-containing film removal is about 70° C.

It is emphasized that temperature conditions in process chamber 12 are controlled by heat controller 32 which has the capability to monitor the temperature in chamber 12 by means of thermocouple 26. The measured temperature is adjusted by heat jacket 18, controlled by controller 32, in accordance with temperature control means well known in the art.

To ensure effective removal of the water-containing film from the semiconductor wafer, the semiconductor wafer is exposed to the liquid or supercritical carbon dioxide-containing composition, under the above conditions, for about 2 minutes to about 30 minutes. More preferably, the time period of exposure of the wafer 16 to the carbon dioxide liquid or supercritical fluid composition, under the above-identified conditions, is about 2 minutes.

The liquid or supercritical fluid composition exiting the process chamber through, outduct 24 may be cleaned and recycled back into the apparatus. In this manner a closed reactor system is formed. Such a closed reactor system is illustrated in FIG. 1. This recycle feature may or may not be provided in the process of the present invention. Obviously, a closed reactor system reduces processing costs at the price of increased capital expense. In the preferred embodiment illustrated in FIG. 1, where such a system is employed, the exhaust supercritical carbon dioxide fluid enters a reservoir 34 through conduit 24 and is recycled back into chamber 12 through conduit 35.

Apparatus 10 is shown provided with a stirring mechanism. In this preferred embodiment, depicted generally at 20, the speed of the stirring unit varies from about 100 rpm to about 1000 rpm. More preferably, stirring occurs at about 500 rpm.

Figure 2:
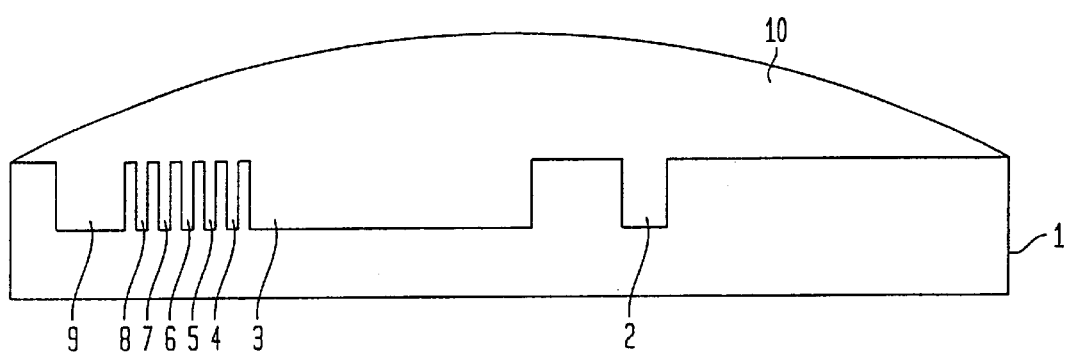
FIG. 2 is a depiction of a wafer having a microelectronic structure thereon which is covered by a water-containing film.

To better appreciate the process of the present invention, attention is directed to FIG. 2. FIG. 2 illustrates a semiconductor wafer 1 which includes a water-containing film 10. Wafer 1 includes trenches, designated by reference numerals 2 to 9, which have varying aspect ratios. As such, wafer 1 is typical of rinsed semiconductor devices wherein openings, such as the depicted trenches, entrap rinse water, especially where the trench has a high aspect ratio. For example, trenches denoted by reference numerals 4 to 8 exemplifies why the process of the present invention is essential to effective rinse water removal. As shown in FIG. 2, the aspect ratio of trenches 4 to 8 are significantly greater than trenches 2, 3 and 9.

The above embodiments are given to illustrate the scope and spirit of the present invention. These embodiments will make apparent, to those skilled in the art, other preferred embodiments and examples. These other embodiments and examples are within the contemplation of the present invention. Thus, the present invention should be limited only by the appended claims.

What is claimed is:

1. A process of drying a semiconductor wafer containing at least one microelectronic structure disposed thereon comprising the steps of:

(a) providing a semiconductor wafer containing at least one microelectronic structure thereon, said semiconductor wafer covered with a water containing film;

(b) providing a composition which comprises liquid or supercritical carbon dioxide in combination with a surfactant and a co-solvent, said co-solvent present in a concentration of between about 1% and about 25% by volume, based on the total volume of said liquid or supercritical carbon dioxide and said co-solvent, said co-solvent selected from the group consisting of a diacid having the structural formula HOOC—$(CH_2)_n$—COOH, where n is 0, 1 or 2; a sulfonic acid having the structural formula $RSO_3H$, where R is hydrogen, methyl, ethyl or $CF_3$; a carboxylic acid having the structural formula $R^1COOH$, where $R^1$ is $CF_3$, $C_2F_5$, hydrogen, methyl, ethyl or propyl; triethanolamine; N-methyl pyrrolidone; gamma-butyrolactone; dimethylsulfoxide; tetrahydrofuran; and mixtures thereof; and (c) removing said water containing film by contacting said semiconductor wafer with said composition, thereby drying said semiconductor wafer.

2. A process in accordance with claim 1 wherein said surfactant comprises between about 0.1% and about 50 by weight, based on the total weight of said composition.

3. A process in accordance with claim 1 wherein said surfactant is selected from the group consisting of siloxanes, fluoroalkanes, polyethers and mixtures thereof.

4. A process in accordance with claim 1 wherein said co-solvent is present in a concentration of between about 5% and about 10% by volume.

5. A process in accordance with claim 1 wherein said composition includes an oxygen-containing compound, said oxygen-containing compound selected from the group consisting of ketals, acetals, ethers and acids.

6. A process in accordance with claim 2 wherein said surfactant comprises between about 0.1% and about 5% by weight, based on the total weight of said composition.

7. A process in accordance with claim 3 wherein said surfactant is selected from the group consisting of 4-(perfluoro-2-isopropyl-1,3-dimethyl-1-butenyloxy) benzoic acid, 4-(perfluoro-2-isopropyl-1,3-dimethyl-1-butenyloxy)benzene sulfonic acid, polyalkylene oxide block copolymers, perfluoropolyether ammonium carboxylate and poly(dimethylsiloxane) copolymers.

8. A process in accordance with claim 5 wherein said oxygen-containing compound is present in a concentration of between about 1% and about 5% by weight, based on the total weight of the composition.

9. A process in accordance with claim 6 wherein said surfactant comprises between about 0.1% and about 1% by weight, based on the total weight of said composition.

10. A process in accordance with claim 8 wherein the molar ratio of said ketal, acetal or ether to said acid is in the range of between about 1:1 and about 10:1.

* * * * *

UNITED STATES PATENT AND TRADEMARK OFFICE
CERTIFICATE OF CORRECTION

PATENT NO.     : 6,398,875 B1
DATED          : June 4, 2002
INVENTOR(S)    : J. Cotte et al.

It is certified that error appears in the above-identified patent and that said Letters Patent is hereby corrected as shown below:

<u>Column 6,</u>
Line 12, "50" should read -- 50% --

Signed and Sealed this

Twenty-third Day of July, 2002

Attest:

Attesting Officer

JAMES E. ROGAN
*Director of the United States Patent and Trademark Office*